(12) United States Patent
So et al.

(10) Patent No.: US 6,989,806 B2
(45) Date of Patent: Jan. 24, 2006

(54) CURRENT LIMITING DEVICE

(75) Inventors: Franky So, San Jose, CA (US); Homer Antoniadis, Mountain View, CA (US); Ian Millard, San Jose, CA (US); Vung Vo, San Diego, CA (US)

(73) Assignee: Osram Opto Semiconductors GmbH, Regensburg (DE)

( * ) Notice: Subject to any disclaimer, the term of this patent is extended or adjusted under 35 U.S.C. 154(b) by 245 days.

(21) Appl. No.: 10/300,157

(22) Filed: Nov. 20, 2002

(65) Prior Publication Data

US 2004/0095300 A1    May 20, 2004

(51) Int. Cl.
*G09G 3/32*    (2006.01)

(52) U.S. Cl. .............................. 345/82; 345/39; 345/40; 345/46; 345/48; 345/55; 345/77; 345/204; 345/205; 345/206; 315/169.3

(58) Field of Classification Search ................ 345/39, 345/40, 46, 48, 55, 77, 204, 205, 206, 82; 315/169.3
See application file for complete search history.

(56) References Cited

U.S. PATENT DOCUMENTS

| | | | | |
|---|---|---|---|---|
| 4,961,630 A | * | 10/1990 | Baron et al. | 349/38 |
| 6,411,172 B2 | * | 6/2002 | Tsukagoshi et al. | 331/158 |
| 2003/0076048 A1 | * | 4/2003 | Rutherford | 315/169.3 |

FOREIGN PATENT DOCUMENTS

| | | |
|---|---|---|
| EP | 1 003 229 A1 | 5/2000 |
| JP | 2001196190 A2 | 7/2001 |
| JP | 2001196191 A2 | 7/2001 |

* cited by examiner

*Primary Examiner*—Ricardo Osorio
*Assistant Examiner*—Vincent E. Kovalick
(74) *Attorney, Agent, or Firm*—Thomas George (57) ABSTRACT

An embodiment of the present invention pertains to an electronic device such as a passive matrix display, an alpha-numeric display, a detector array, or a solar cell array. The electronic device includes multiple organic optoelectronic devices and one or more of these organic optoelectronic devices are protected from shorts. Each of the one or more organic optoelectronic devices that is protected from a short has one of its electrodes coupled to a first current limiting device and optionally has another electrode coupled to a second current limiting device. Also, one of the electrodes of that organic optoelectronic device, the first current limiting device, or the second current limiting device is patterned.

27 Claims, 10 Drawing Sheets

Passive Matrix OLED Display
203

CURRENT LIMITING DEVICE

BACKGROUND OF THE INVENTION

1. Field of the Invention

This invention relates generally to an organic optoelectronic device and in particular to a structure for minimizing the effects of a defective organic optoelectronic device.

2. Description of the Related Art

Electronic devices such as passive matrix displays, alphanumeric displays, detector arrays, or solar cell arrays include multiple organic optoelectronic devices ("elements"). These elements can be, for example, organic light emitting diodes ("OLEDs") (the OLEDs can be used in, for example, displays or as the light source elements of a light source), light detectors, and solar cells.

In the electronic device, one of the major reasons for its failure is an electrical short occurring in one or more of the elements. A short occurs when any imperfection in the element structure causes its cathode to be in direct contact (or very close proximity) with its anode resulting in an area of much lower resistance than the remaining area between the anode and the cathode. Shorts may occur in any of the layers forming the element and may be caused by, for example, substrate imperfections or asperities, anode layer irregularities, non-uniformity of the one or more organic layers, and airborne particles introduced in the element structure during handling.

Figure 1:
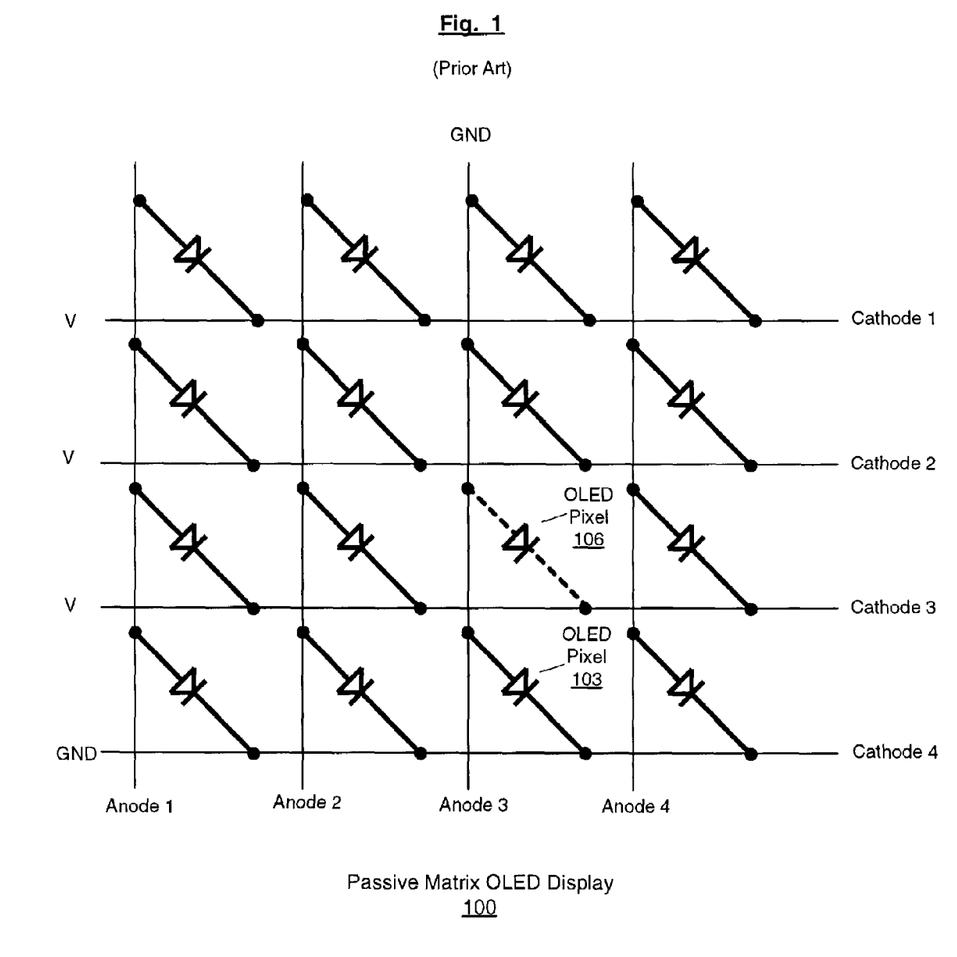
FIG. 1 shows a prior art passive matrix OLED display.

In the electronic device, a short may result in several types of cross-talk depending upon the manner in which the device is driven. As an example, FIG. 1 shows the effects of a shorted element on an electronic device. FIG. 1 shows a prior art passive matrix OLED display 100. Here, anodes of the OLED pixels are parallel strips of column electrodes, and cathodes of the OLED pixels are parallel strips of row electrodes. Each OLED pixel includes typically one or more organic layers and light is emitted from one of these layers. In order to produce a display image, for example, each row of cathodes is sequentially addressed and if any of the OLEDs within the addressed row are to be activated then the columns to which these OLEDs belong are set to a voltage "V". For example, in FIG. 1, in order to address an OLED pixel 103 so that it doesn't emit light, cathode 1, cathode 2, and cathode 3 are set to voltage "V" and cathode 4 is set to zero voltage. Also, anode 3 is set to zero voltage. Since the OLED pixel 106 is not being addressed, it is reverse biased (i.e., its cathode is at a voltage "V" and its anode is at zero voltage). If the OLED pixel 106 is not shorted, then in reverse bias, no current or only a small amount of leakage current will flow across it. If, however, the OLED pixel 106 is shorted, then current will readily flow across it since the resistance is very low and thus the anode 3 will also be at the voltage "V" resulting in the OLED pixel 103 emitting light even though this OLED is not intended to emit light as shown by anode 3 being set to zero voltage. In the case that the OLED pixel 106 is shorted, since each cathode is addressed sequentially, all the OLEDs attached to anode 3 will emit light and a line at anode 3 will appear. Therefore, a short in a single OLED can result in cross-talk that makes it appear, for example, that the whole column is damaged. In this case, the shorted OLED causes a bright vertical line (i.e., a "ghost image") to appear resulting in a lower display quality or even rendering the display unusable.

For the foregoing reasons, there exists a need to isolate an individual defective element so that there is a visible defect only at the defective element thus minimizing the effect of this defective element on the electronic device.

SUMMARY

Embodiments of the present invention are directed to, for example, minimizing the effect of a defective element on an electronic device. A first embodiment of the electronic device is described. This embodiment of the electronic device includes multiple organic optoelectronic devices and one of those optoelectronic devices has a top electrode and a bottom electrode. This embodiment of the electronic device also includes at least one current limiting device where at least one of: (1) a first one of the at least one current limiting device is coupled to the top electrode, and (2) a second one of the at least one current limiting device is coupled to the bottom electrode. Also, one of the electrodes of the particular one of the multiple organic optoelectronic devices, the first one of the at least one current limiting device, or the second one of the at least one current limiting device is patterned.

A first embodiment of a protected organic optoelectronic device is also described. This embodiment of the device includes a bottom electrode on a substrate, at least one organic layer on the bottom electrode, and a top electrode that includes: (1) a first portion of the top electrode, (2) a current limiting device on the first portion of the top electrode, and (3) a second portion of the top electrode on the current limiting device. Here, the current limiting device includes a fuse on the first portion of the top electrode, and a dielectric on the first portion of the top electrode that surrounds the fuse. The fuse couples together the first portion of the top electrode and the second portion of the top electrode.

A second embodiment of the protected organic optoelectronic device is described. This embodiment of the device includes a substrate and a bottom electrode that includes: (1) a first portion of the bottom electrode on the substrate, (2) a current limiting device on the first portion of the bottom electrode, and (3) a second portion of the bottom electrode on the current limiting device. The current limiting device includes a dielectric between the first portion and the second portion of the bottom electrode and also a fuse on the dielectric that couples together the first portion and the second portion of the bottom electrode. The protected organic optoelectronic device also includes at least one organic layer on the bottom electrode and a top electrode on the at least one organic layer.

A third embodiment of the protected organic optoelectronic device is also described. This embodiment of the device includes an organic optoelectronic device and at least one diode, where at least one of: (1) a first one of the at least one diode is coupled to the organic optoelectronic device, and (2) a second one of the at least one diode is coupled to the organic optoelectronic device.

An embodiment of an organic light emitting diode integrity checking system to disable questionable OLEDs within an OLED display is also described. This embodiment of the system includes: (1) an OLED testing system, (2) an OLED coupled to the OLED testing system where that OLED has a top electrode and a bottom electrode; and (3) a current limiting device coupled to one of the electrodes of the OLED. The OLED testing system reverse biases the OLED and if the OLED testing system detects a reverse leakage current higher than a preset value, then it outputs a current at a rate that causes the current limiting device to prevent current flow across the OLED.

DETAILED DESCRIPTION

An embodiment of the present invention pertains to an electronic device such as a passive matrix display or an alpha-numeric display. The electronic device includes multiple organic optoelectronic devices ("elements") and one or more of these elements are protected from shorts. Each of the one or more elements that are protected from a short has one of its electrodes coupled to a first current limiting device and optionally has another electrode coupled to a second current limiting device. Also, one of the electrodes of the element, the first current limiting device, or the optional second current limiting device is patterned.

Figure 2:
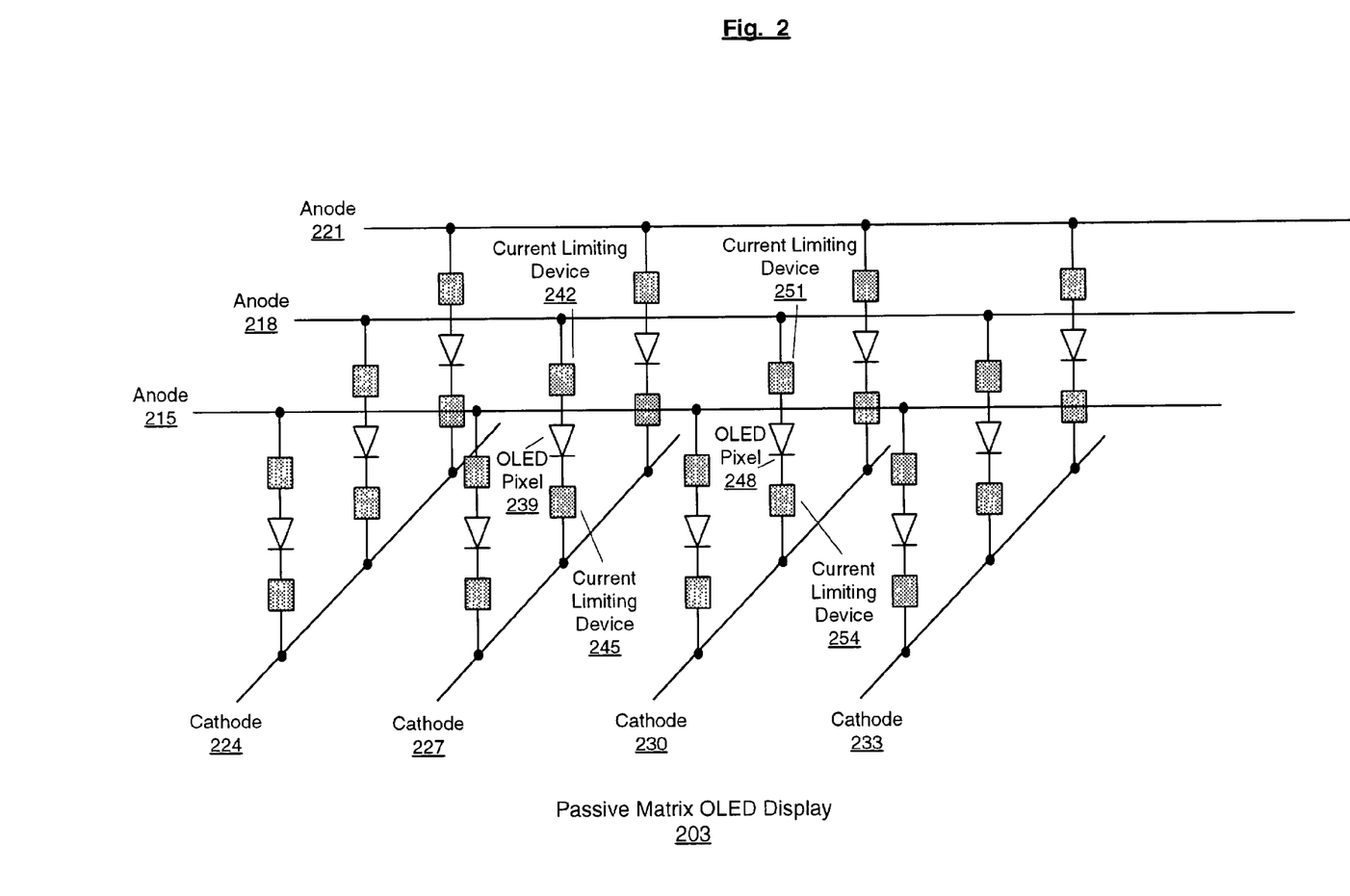
FIG. 2 shows a first embodiment of an electronic device according to the present invention.

FIG. 2 shows a first embodiment of an electronic device according to the present invention. In this embodiment, the electronic device is a passive matrix OLED display 203. The passive matrix OLED display 203 includes a patterned top electrode (e.g., the row of anodes: an anode 215, an anode 218, and an anode 221) and a patterned bottom electrode (e.g., the row of cathodes: a cathode 224, a cathode 227, a cathode 230, and a cathode 233). Between the anodes and the cathodes are multiple OLEDs. A current limiting device 251 is coupled to an anode of an OLED pixel 248 and a current limiting device 254 is coupled to a cathode of the OLED pixel 248. The coupling of the current limiting device to one of the electrodes of the OLED pixel, as used herein, includes coupling the current limiting device to any one of the layers of the OLED pixel's electrode. The OLED pixel 248 emits light when, for example, the anode 218 is at a voltage "V" and the cathode 230 is at zero voltage. In another configuration of this embodiment, only one current limiting device is used, i.e., only the current limiting device 251 is coupled to the anode of the OLED pixel 248, or only the current limiting device 254 is coupled to the cathode of the OLED pixel 248.

Depending on the configuration, the current limiting devices either one by itself or together prevent a short between the anode and the corresponding cathode. The current limiting devices prevents the short by acting as a fuse by creating an open circuit when the current flow across it is too high, or by decreasing the current flow across it when it is reverse biased. By doing this, one or both of the current limiting devices isolates the defective OLED pixel and eliminates or limits the current flow across the defective pixel thus eliminating or minimizing the cross-talk.

In FIG. 2, by isolating the defective OLED pixel, one or both of the current limiting devices 206, 212 eliminates the bright vertical line problem described earlier. For example, in FIG. 2, in order to address one of the OLED pixels coupled to the cathode 230, the other columns (i.e., the cathode 224, the cathode 227, and the cathode 233) are set to a voltage "V" (e.g., the voltage "V" can be from 5.5 V to 7.5 V) and the cathode 230 is set to zero voltage. In the cathode 230 column, in order to set the OLED pixel 248 so that it does not emit light, the anode 218 is set to zero voltage. In the case of the OLED pixel 239, since it belongs to a cathode row not currently addressed, it is reverse biased (i.e., its cathode is at a voltage "V" and its anode is at zero voltage). If the OLED pixel 239 is not shorted, then in reverse bias, no current or only a small amount of leakage current will flow across it. If, however, the OLED pixel 239 is shorted, then depending on the number of current limiting devices used, the current limiting device 242 and/or the current limiting device 245 will prevent any current from flowing to the anode 218 or it will limit the current flow to the anode 218 under the reverse bias condition. By doing this, the current limiting device 242 and/or the current limiting device 245 isolates the visible defect to only the defective OLED pixel and prevents it from negatively affecting the rest of the passive matrix OLED display 203.

Figure 3:
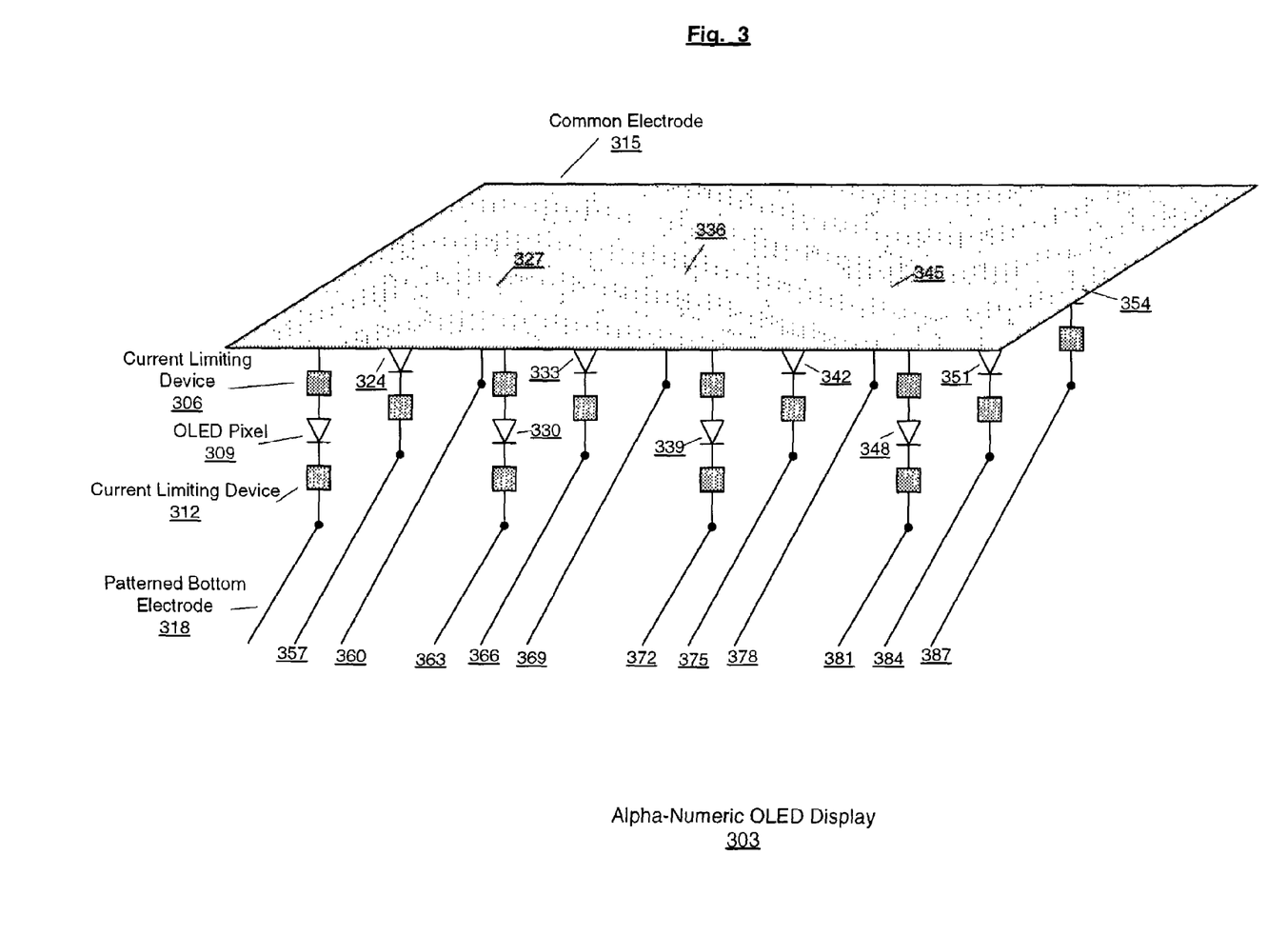
FIG. 3 shows a second embodiment of the electronic device according to the present invention.

FIG. 3 shows a second embodiment of the electronic device according to the present invention. In this embodiment, the electronic device is an alpha-numeric OLED display 303. In one configuration of this embodiment, the top electrode is a common electrode 315 for all the OLED pixels within this display (e.g., an OLED pixel 309, 324, 327, and 330) and the bottom electrode is patterned. The alpha-numeric OLED display 303 includes an OLED pixel 309 and a current limiting device 306 coupled to an anode of the OLED pixel 309. Also, a current limiting device 312 is coupled to a cathode of the OLED pixel 309. In the alpha-numeric OLED display 303, the patterned bottom electrodes act as lead-in lines to the OLED pixels (e.g., a patterned bottom electrode 318 acts as a lead-in line for the OLED pixel 309).

By isolating a shorted OLED pixel, the current limiting device prevents not being able to activate any of the OLED pixels in the display due to the short. For example, referring to FIG. 3, if the common electrode 315 is set to the voltage "V", the electrode 318 is set to zero voltage, and the OLED pixel 309 is shorted, then without either one of the current limiting devices 306, 312, none of the other OLED pixels can be activated since the common electrode 315 is at zero voltage.

In other configurations of this embodiment, the bottom electrode is a common electrode while the top electrode is patterned or both the top and the bottom electrodes are common electrodes. Also, in other configurations, only one current limiting device is used, i.e., only the current limiting device 306 is coupled to the anode end of the OLED pixel 309, or only the current limiting device 312 is coupled to the cathode end of the OLED 309. If only one current limiting device is used and one electrode is a common electrode and the other electrode is patterned, then, preferably, that current limiting device is coupled to the patterned electrode side of the OLED pixel, otherwise, the advantage of having the common electrode is lost since the current limiting device is patterned on that side.

Figure 4:
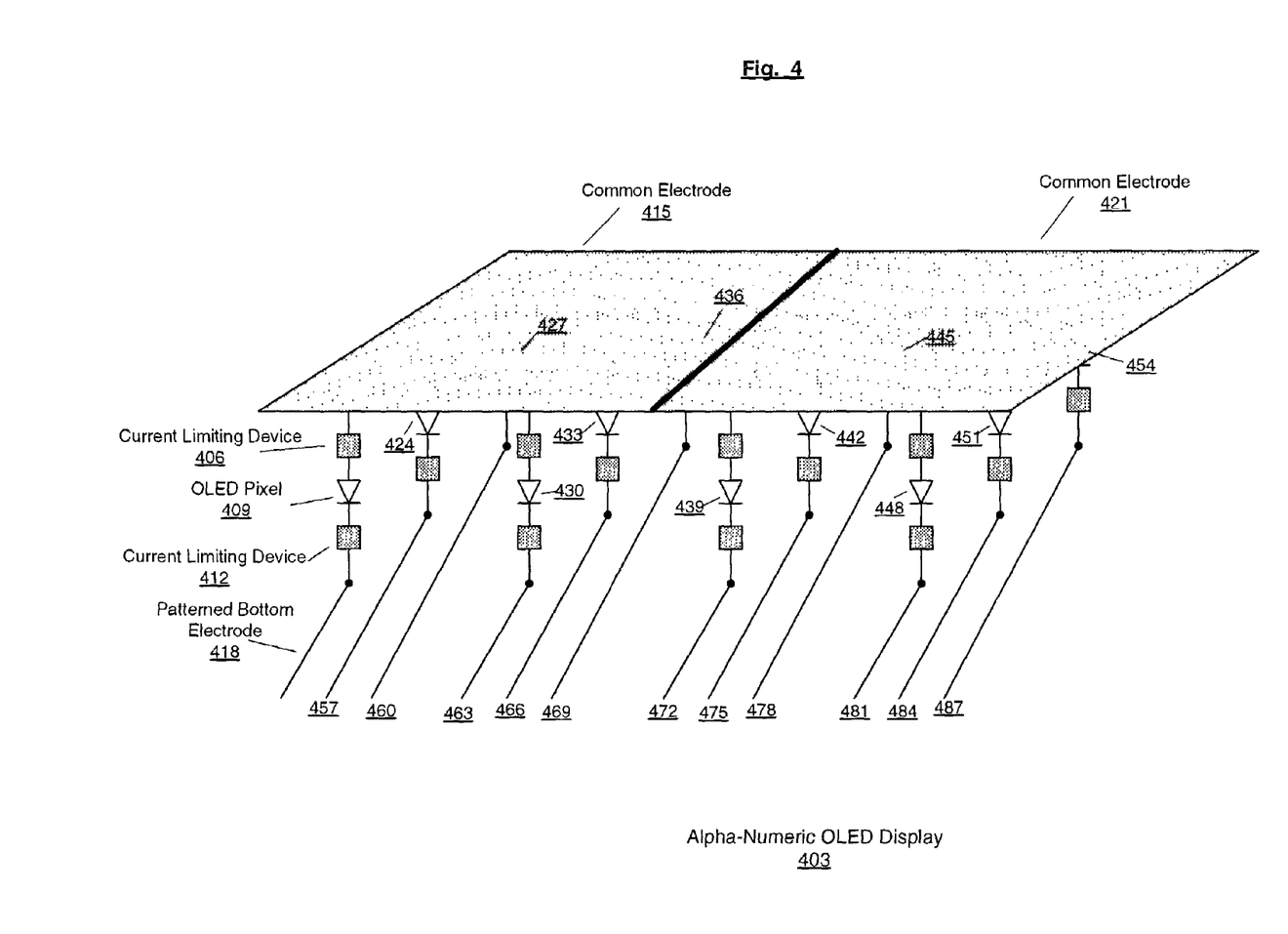
FIG. 4 shows a third embodiment of the electronic device according to the present invention.

FIG. 4 shows a third embodiment of the electronic device according to the present invention. In this embodiment, the electronic device is an alpha-numeric OLED display 403 having one electrode that is patterned and the opposite electrode includes multiple common electrodes. For example, as shown in FIG. 4, the bottom electrode is patterned as strips and the top electrode includes a common electrode 415 and a common electrode 421. The OLED pixels 409, 424, 427, 430, 433, and 436 are coupled to the common electrode 415, and the OLED pixels 439, 442, 445, 448, 451, and 454 are coupled to the common electrode 421. The term "coupled" includes both a direct coupling and an indirect coupling between the OLED pixels and the electrodes. In the alpha-numeric OLED display 403, the patterned bottom electrodes act as lead-in lines to the OLED pixels (e.g., a patterned bottom electrode 418 acts as a lead-in line for the OLED pixel 409).

In other configurations of this embodiment, the bottom electrodes are multiple common electrodes while the top electrodes are patterned lead-in lines, or, both the top and the bottom electrodes each are multiple common electrodes. Also, in other configurations, only one current limiting device is used, e.g., only the current limiting device 406 is coupled to the anode end of the OLED pixel 409, or only the current limiting device 412 is coupled to the cathode end of the OLED pixel 409. If only one current limiting device is used and one side are multiple common electrodes while the other electrode is patterned as lead-in lines, then, preferably, that current limiting device is coupled to the patterned lead-in lines side of the OLED pixel, otherwise, the advantage of having the multiple common electrodes is lost since the current limiting device is patterned on that side.

In other embodiments of the electronic device, the electronic device is a detector array, a solar cell array, or a light source in which the multiple elements of the electronic device are light detectors, solar cells, or OLEDs respectively.

Figure 5:
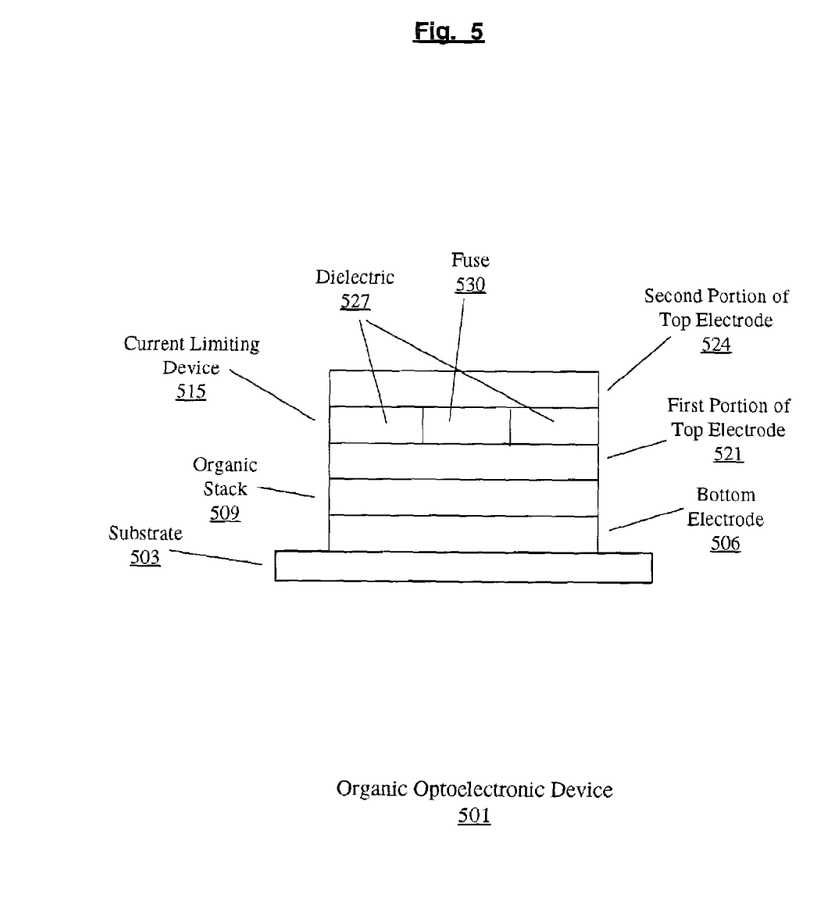
FIG. 5 shows a first embodiment of an element coupled to a current limiting device according to the present invention.

FIG. 5 shows a first embodiment of an element coupled to a current limiting device according to the present invention. In this embodiment, an organic optoelectronic device 501 includes a bottom electrode 506 that is deposited on a substrate 503. As used within the specification and the claims, the term "on" includes when layers are in physical contact and when layers are separated by one or more intervening layers. An organic stack 509 that includes one or more organic layers is deposited on the bottom electrode 506. The organic stack 509 can include, for example, an emissive layer if the organic optoelectronic device is an OLED used in displays or light sources, or a light-responsive layer if the electronic device is a light detector or a solar cell. A first portion of top electrode 521 is deposited on the organic stack 509. A current limiting device 515 is deposited on the first portion of the top electrode 521. A second portion of top electrode 524 is deposited on the current limiting device 515. In this embodiment, the bottom electrode is the anode and the top electrode is the cathode or alternatively, the bottom electrode is the cathode and the top electrode is the anode.

The current limiting device 515 includes a fuse 530 that is deposited on the first portion of the top electrode 521. A dielectric 527 is deposited around the fuse 530. The fuse 530 couples together the first portion of the top electrode 521 and the second portion of the top electrode 524. The fuse 530 interrupts the current flow between the two portions of the top electrode when the current flow is above a threshold value. Under normal operating conditions, the voltage drop across the fuse 530 is less than one volt, preferably less than 0.5 volt, and most preferably less than 0.2 volt. The fuse 530 interrupts current flow, i.e., the threshold value is reached when the current flow is greater than the current flow under normal operating conditions by a certain factor such as by a factor of ten, a factor of five, or a factor of two. The fuse 530 can be comprised of the same material as that of the bottom electrode or the top electrode. These electrodes are comprised of conductive materials such as indium tin oxide ("ITO"), aluminum, indium, silver, gold, magnesium, calcium, and barium or combinations thereof. Also, the fuse 530 can be comprised of a conducting material of variable resistance that is relatively good conductor under moderate current flow, but becomes highly resistive or non-conducting under high current flow (e.g., the high current flow occurs when the flow is greater than under normal operating conditions by a factor of ten, five, or two). Examples of this type of material include barium tintanate ($BaTiO_3$). The dielectric 527 is, for example, photoresists, polyimides, metal-oxides, metal-nitrides, or metal-oxi-nitrides including silicon oxides and nitrides.

Figure 6:
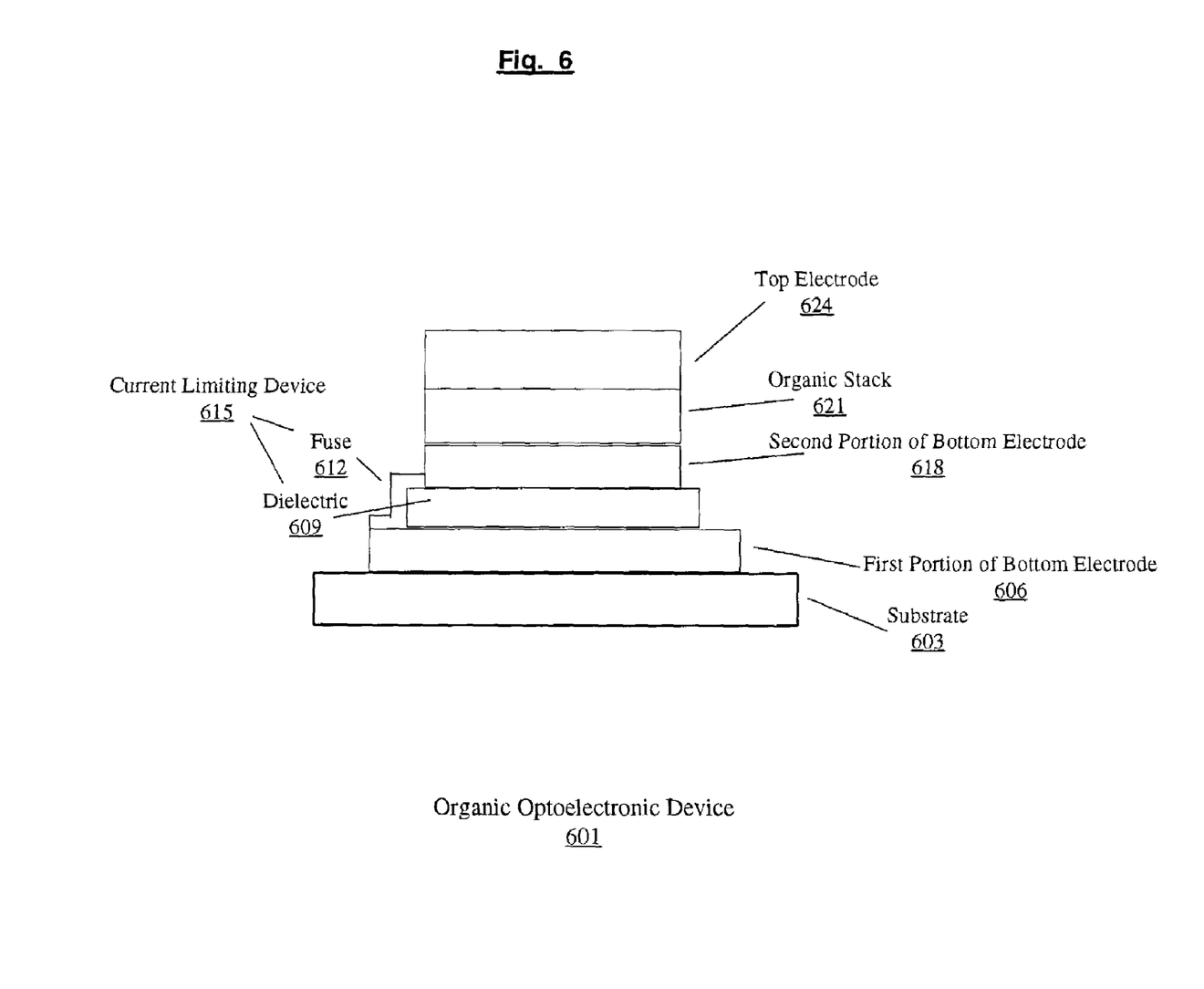
FIG. 6 shows a second embodiment of an element coupled to a current limiting device according to the present invention.

FIG. 6 shows a second embodiment of an organic optoelectronic device coupled to a current limiting device according to the present invention. In this embodiment, an organic optoelectronic device 601 includes a first portion of a bottom electrode 606 that is deposited on a substrate 603. A dielectric 609 is deposited on the first portion of a bottom electrode 606. A second portion of the bottom electrode 618 is deposited on the dielectric 609. A current liming device 615 couples together the first portion of the bottom electrode 606 and the second portion of the bottom electrode 618. The current liming device 615 includes the dielectric 609 and a fuse 612. The fuse 612 is deposited on the dielectric 609 and makes contact with both the first portion and the second portion of the bottom electrode 618 to electrically couple these two portions together. The fuse may be unpatterned or patterned as strips that couple together the two portions of the bottom electrode. The fuse 612 interrupts the current flow between these two portions of the bottom electrode when the current flow is above a threshold value. Under normal operating conditions, the voltage drop across the fuse 612 is less than one volt, preferably less than 0.5 volt, and most preferably less than 0.2 volt. The fuse 612 interrupts current flow, i.e., the threshold value is reached when the current flow is greater than the current flow under normal operating conditions by a certain factor such as by a factor of ten, a factor of five, or a factor of two. The fuse 612 is comprised of any one of: (1) a metal, (2) a combination of the metal and an organic material, (3) a combination of the metal and a photoresist material, (4) a combination of the metal and a polycindine material, (5) a combination of the metal and an oxide material, or (6) a mixture of combinations of (1) through (5). The dielectric 609 is, for example, photoresists, polyimides, metal-oxides, metal-nitrides, or metal-oxi-nitrides including silicon oxides and nitrides.

The organic optoelectronic device 601 also includes an organic stack 509 that is deposited on the second portion of the bottom electrode 618. The organic stack 509 includes one or more organic layer. The organic stack 509 can include, for example, emissive layers if the organic optoelectronic device is an OLED used in displays or light sources, or light-responsive layers if the electronic device is a light detector or a solar cell. A top electrode 624 is deposited on the organic stack 621. In this embodiment, the bottom electrode is the anode and the top electrode is the cathode or alternatively, the bottom electrode is the cathode and the top electrode is the anode.

Figure 7:
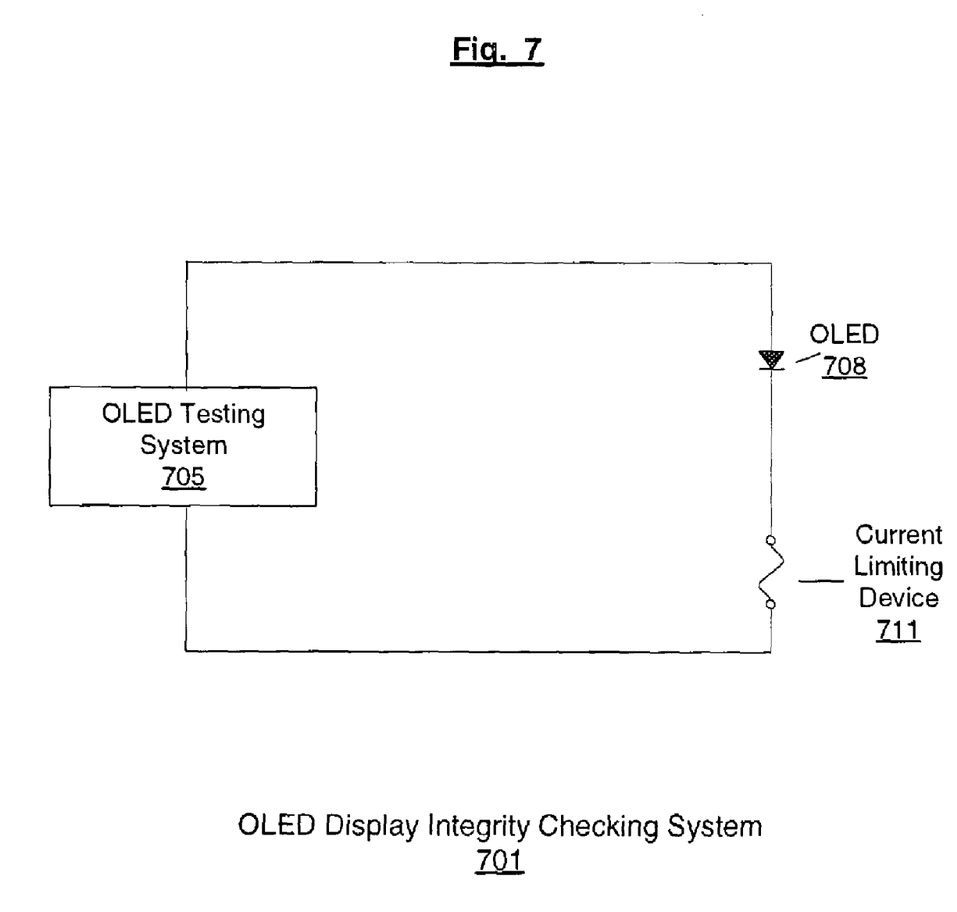
FIG. 7 shows an OLED display integrity checking system according to the present invention.

FIG. 7 shows an OLED display integrity checking system according to the present invention. The OLED display integrity checking system 701 includes an OLED testing system 705 that is coupled to the anodes and cathodes of the OLEDs belonging to an OLED display. The OLED display integrity checking system 701 also includes an OLED 708 that, as stated earlier, is coupled to the OLED integrity checking system 701. A current limiting device 711 protects the OLED 708 and interrupts or prevents current flow when a threshold value is reached. The current limiting device 711 is coupled to one of the electrodes of the OLED 708. The current limiting device 711 includes one of the current limiting devices described earlier as the first embodiment of the organic optoelectronic device or the second embodiment of the organic optoelectronic device. In checking the integrity of the OLED 708, the OLED testing system 705 reverse biases the OLED 708. If the OLED testing system 705 detects a leakage current higher than a preset value, then it produces a current flow through the OLED 708 that is greater than or equal to the threshold value so that the current limiting device prevents current flow across the OLED 708 thus disabling it (e.g., the OLED is disabled by the current limiting device creating an open circuit). In a similar manner, all the OLEDs within the OLED display can be checked to determine if questionable OLEDs exist (e.g., questionable OLEDs are OLEDs that when reverse biased, produce leakage current higher than a preset value). By doing this, a questionable OLED is disabled before it shorts during display operation.

Figure 8A:
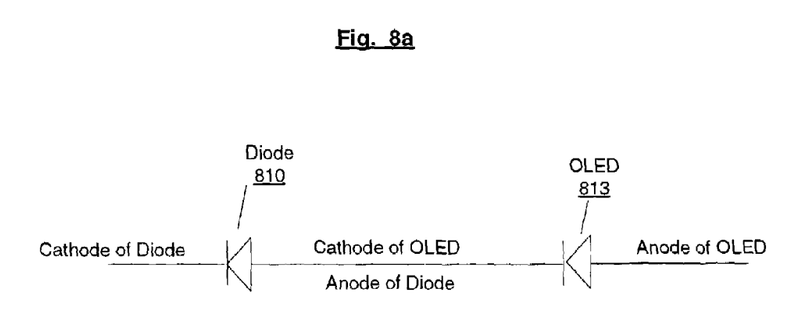
FIGS. 8a–c show a third embodiment of an element coupled to a current limiting device according to the present invention.
Figure 8B:
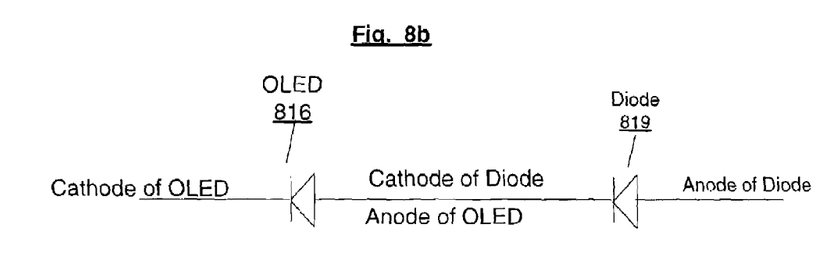
Figure 8C:
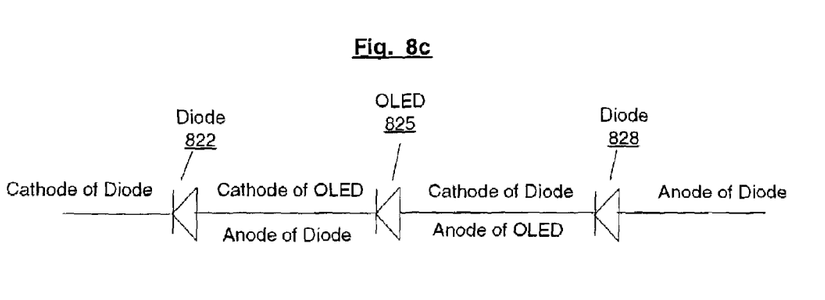

FIGS. 8*a–c* show a third embodiment of an organic optoelectronic device coupled to a current limiting device according to the present invention. In this embodiment, the current limiting device is a diode that is coupled in series with the organic optoelectronic device (e.g., an OLED). The diode protects the organic optoelectronic device from high leakage current under the reverse bias condition. Under forward bias, the voltage drop across the current limiting diode is less than two volts, preferably less than one volt. Under reverse bias, the current limiting diode has a high resistance and a high voltage drop to limit the leakage current from the organic optoelectronic device that is allowed to pass through. FIG. 8*a* shows a first configuration of this embodiment in which only one diode is used; here, an anode of a diode 810 is coupled to a cathode of an OLED 813. FIG. 8*b* shows a second configuration in which only one diode is used; here, a cathode of a diode 819 is coupled to an anode of an OLED 816. FIG. 8*c* shows a third configuration in which diodes are coupled both to the anode and cathode of the OLED 825; here, an anode of a diode 822 is coupled to a cathode of an OLED 825 and a cathode of a diode 828 is coupled to an anode of the OLED 825.

Figure 9A:
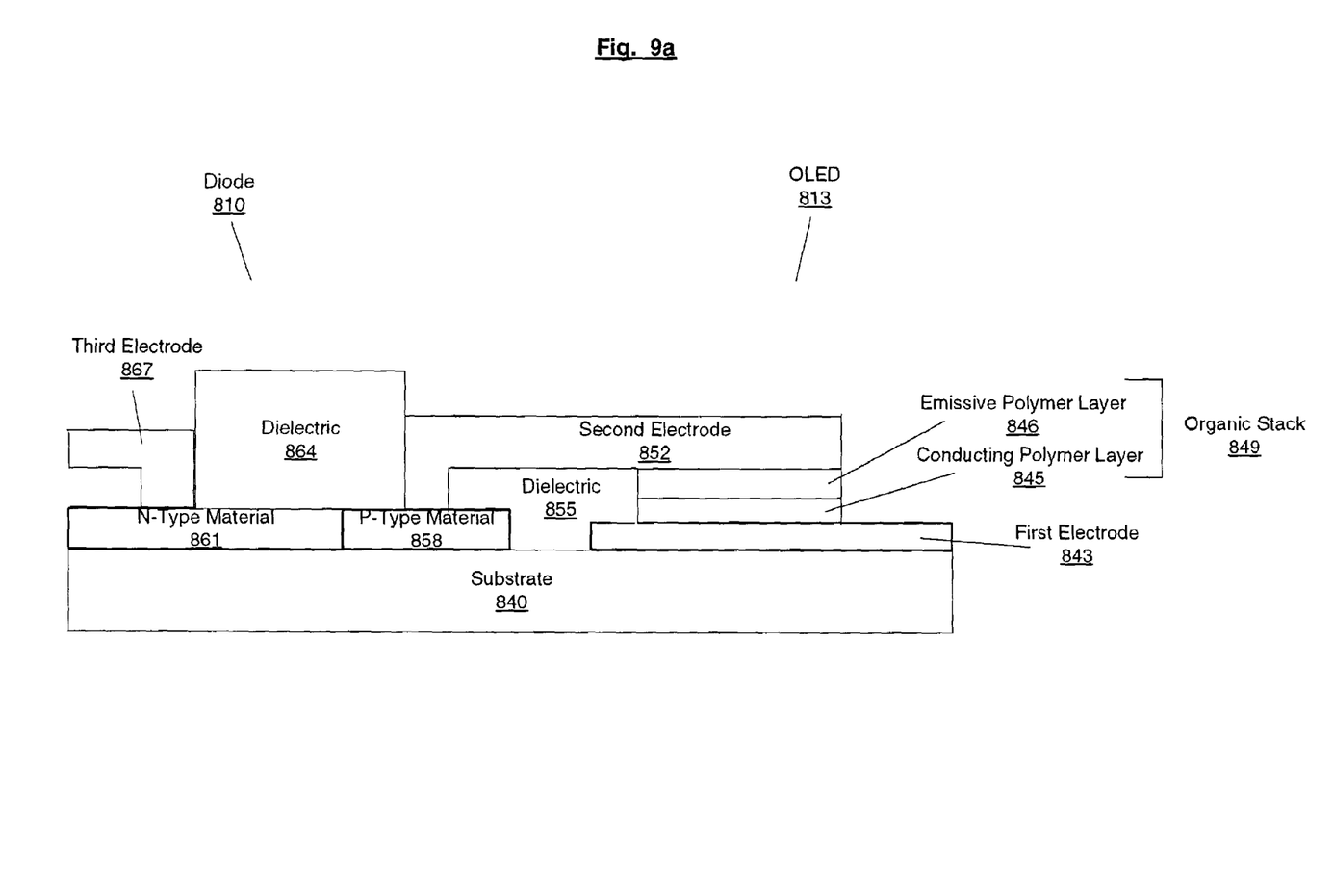
FIGS. 9a–b show a cross-sectional view of the third embodiment of an organic optoelectronic device coupled to a current limiting device according to the present invention.
Figure 9B:
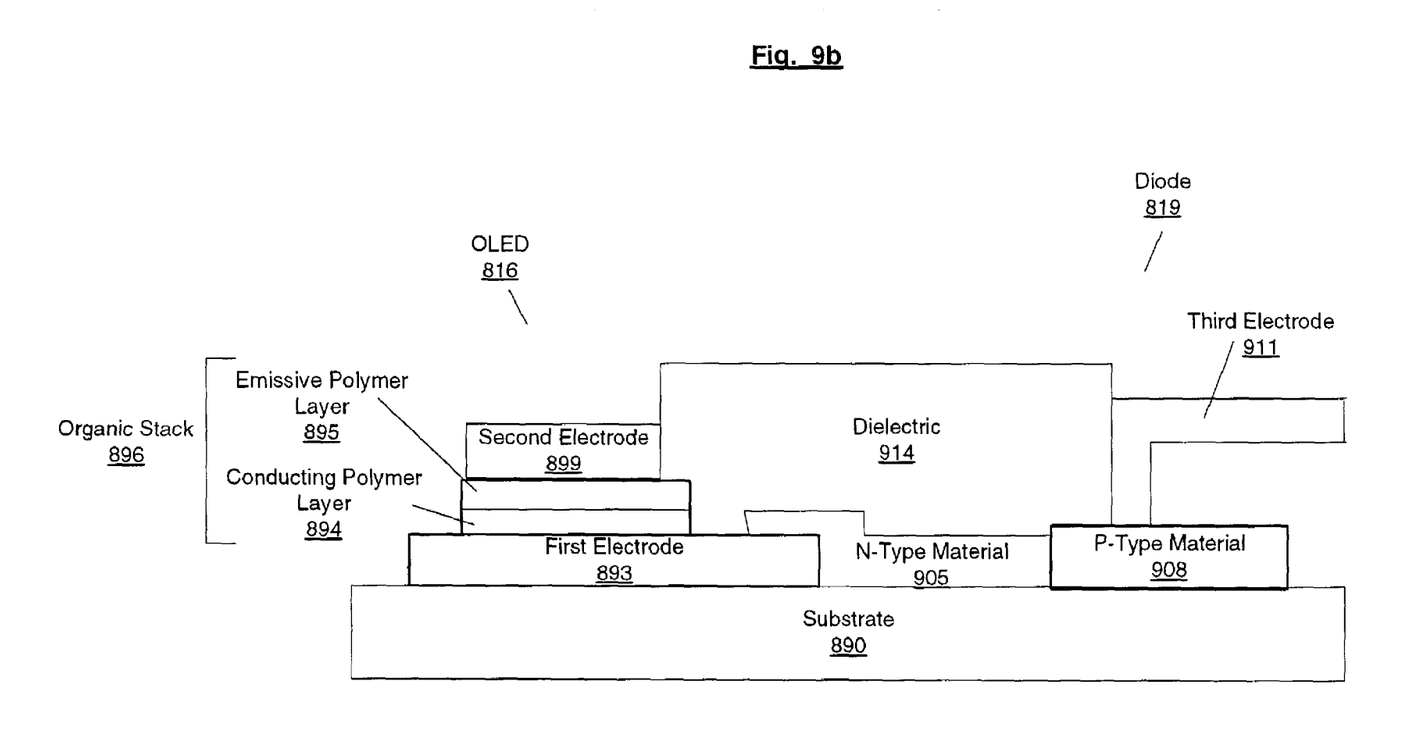

FIGS. 9*a–b* show a cross-sectional view of the third embodiment of an organic optoelectronic device coupled to a current limiting device according to the present invention. In FIGS. 9*a–b* and the descriptions for these figures, the organic optoelectronic device is shown as an OLED, however, the OLED can be substituted with other organic optoelectronic devices such as a light detector or a solar cell. In one configuration of this embodiment only one diode is used; here, the cathode of the OLED is coupled to the anode of the diode (this configuration is shown above in FIG. 8*a*). The OLED 813 includes a first electrode 843 deposited on the substrate 840. In this configuration, the first electrode 843 is an anode. The OLED 813 is comprised of an organic stack 849 deposited on the first electrode 843. The organic stack 849 includes two or more organic layers (e.g., a n-type material such as a conducting polymer layer 845 and a p-type material such as an emissive polymer layer 846). A second electrode 852 is deposited on the organic stack 849. The second electrode 852 couples together the OLED 813 and the diode 810 (e.g., the second electrode 852 couples together the anode-end of the diode 810 with the cathode-end of the OLED 813 allowing current to flow across these two devices). The diode 810 includes a p-type material 858 that is deposited on the substrate 840 and this material is coupled to the second electrode 852. In addition to the p-type material 858, the diode 810 also includes a n-type material 861 that is deposited on the substrate 840. The n-type material 861 and the p-type material 858 when coupled together form a junction. A third electrode 867 provides a path for current flow to and from the cathode-end of the diode 810. The dielectric 864 acts as an insulator to electrically separate the n-type material 861 and the third electrode 867 from the second electrode 852. The dielectric 855 acts as an insulator to electrically separate the p-type material 858 from the p-type material 845 and the first electrode 843.

In another configuration of this embodiment again only one diode is used; here, however, the anode of the OLED 816 is coupled to the cathode of the diode 819 (this configuration is shown above in FIG. 8*b*). The OLED 816 includes a first electrode 893 deposited on the substrate 890. In this configuration, the first electrode 893 is an anode. The OLED 816 is comprised of an organic stack 896 deposited on the first electrode 893. The organic stack 896 includes two or more organic layers (e.g., a p-type material such as a conducting polymer layer 894 and n-type material such as an emissive polymer layer 895). A second electrode 899 is deposited on the organic stack 896. The second electrode 899 provides a path for current flow to and from the OLED 816.

The first electrode 893 couples together the OLED 816 and the diode 819 (e.g., the first electrode 893 couples together the anode-end of the OLED 816 with the cathode-end of the diode 819 allowing current to flow across these two devices). The diode 819 includes a n-type material 905 that is deposited on the substrate 890 and this material is coupled to the first electrode 893. In addition to the n-type material 905, the diode 819 also includes a p-type material 908 that is deposited on the substrate 890. The n-type material 905 and the p-type material 908 when coupled together form a junction. A third electrode 911 provides a path for current flow to and from the anode-end of the diode 819. The dielectric 914 acts as an insulator to electrically separate the OLED 816 from the p-type material 908 and the third electrode 911, and also to separate the n-type material 905 from the organic stack 896 and the second electrode 899.

In one configuration of this embodiment, the diode is a silicon diode such as a p-i-n diode or a Schottky diode. In these diodes, the voltage drop is negligible under forward bias (the voltage drop is less than two volts, preferably less than one volt) while under reverse bias, a high resistance will prevent the flow of leakage current. Such silicon diodes can be made with low temperature polysilicon ("LTPS"), polycrystalline silicon, amorphous silicon, or single crystalline silicon.

In the case that the current limiting device is a silicon diode, referring back to FIG. 9*a*, the n-type material 861 is comprised of a n-type silicon and the p-type material 858 is comprised of a p-type silicon. The dielectrics 864 and 855 are comprised of dielectric material such as silicon nitride. In FIG. 9*b*, in the case of the silicon diode, the n-type material 905 is comprised of a n-type silicon and the p-type material 908 is comprised of a p-type silicon. The dielectric 914 is comprised of dielectric material such as silicon nitride. As is generally known, under forward bias, current readily flows through the silicon diode, however, under reverse bias, very little current is allowed to flow across that diode.

As any person of ordinary skill in the art of organic optoelectronic device fabrication will recognize from the description, figures, and examples that modifications and changes can be made to the preferred embodiments of the invention without departing from the scope of the invention defined by the following claims.

What is claimed:

1. An electronic device, comprising:
a plurality of organic optoelectronic devices, a particular one of the plurality of organic optoelectronic devices having a top electrode and a bottom electrode; and
at least one current limiting device,
wherein at least one of: (1) a first one of the at least one current limiting device is coupled to the top electrode, and (2) a second one of the at least one current limiting device is coupled to the bottom electrode, and
wherein one of the electrodes of the particular one of the plurality of organic optoelectronic devices, the first one of the at least one current limiting device, or the second one of the at least one current limiting device is patterned.

2. The electronic device of claim 1 wherein the current limiting device coupled to the top electrode includes
a first portion of the top electrode; the current limiting device on the first portion of the top electrode; and
a second portion of the top electrode on the current limiting device,
wherein the current limiting device includes
a fuse on the first portion of the top electrode; and
a dielectric on the first portion of the top electrode that surrounds the fuse,
wherein the fuse couples together the first portion of the top electrode and the second portion of the top electrode.

3. The electronic device of claim 1 wherein the current limiting device coupled to the bottom, electrode includes
a first portion of the bottom electrode;
the current limiting device on the first portion of the bottom electrode; and
a second portion of the bottom electrode on the current limiting device,
wherein the current limiting device includes
a dielectric between the first portion and the second portion of the bottom electrode; and
a fuse on the dielectric that couples together the first portion and the second portion of the bottom electrode.

4. The electronic device of claim 1 wherein the at least one current limiting device is at least one diode, and
wherein at least one of: (1) a first one of the at least one diode is coupled to the top electrode, and (2) a second one of the at least one diode is coupled to the bottom electrode.

5. The electronic device of claim 1 wherein the device is any one of a passive matrix display, an alpha-numeric display, a passive matrix detector array, a non-passive matrix detector away, a light source, or a solar cell array.

6. The electronic device of claim 1 wherein the plurality of organic optoelectronic devices are any one of: (1) a plurality of organic light emitting diodes, (2) a plurality of light source elements, (3) a plurality of solar cells, or (4) a plurality of light detectors.

7. A protected organic optoelectronic device, comprising:
a substrate;
a bottom electrode on the substrate;
at least one organic layer on the bottom electrode;
a top electrode including
a first portion of the top electrode;
a current limiting device on the first portion of the top electrode; and
a second portion of the top electrode on the current limiting device,
wherein the current limiting device includes
a fuse on the first portion of the top electrode; and
a dielectric on the first portion of the top electrode that surrounds the fuse,
wherein the fuse couples together the first portion of the top electrode and the second portion of the top electrode.

8. The protected organic optoelectronic device of claim 7 wherein the fuse is a via that is filled with a conductive material.

9. The protected organic optoelectronic device of claim 7 wherein the fuse is comprised of a conductive material that has variable resistance.

10. The protected organic optoelectronic device of claim 7 wherein the dielectric is comprised of any one of: photoresists, polyimides, metal-oxides, metal-nitrides, or metal-oxi-nitrides.

11. The protected organic optoelectronic device of claim 7 wherein the first portion of the top electrode is a metallic layer and the second portion of the top electrode is a patterned strip or a common plane.

12. The protected organic optoelectronic device of claim 7 wherein the device is any one of: an organic light emitting diode, a light source element, a light detector, or a solar cell.

13. A protected organic optoelectronic device, comprising:
a substrate;
a bottom electrode that includes
a first portion of the bottom electrode on the substrate;
a current limiting device on the first portion of the bottom electrode; and
a second portion of the bottom electrode on the current limiting device,
wherein the current limiting device includes
a dielectric between the first portion and the second portion of the bottom electrode; and
a fuse on the dielectric tat couples together the first portion and the second portion of the bottom electrode;
at least one organic layer on the bottom electrode; and
a top electrode on the at least one organic layer.

14. The protected organic optoelectronic device of claim 13 wherein the fuse is patterned strips on the dielectric and wherein the fuse is comprised of any one of: (1) a metallic layer, (2) a combination of the metallic layer and an organic layer, (3) a combination of the metallic layer and a photoresist layer, (4) a combination of the metallic layer and a polycindine layer, (5) a combination of the metallic layer and an oxide layer, or (6) a mixture thereof.

15. The protected organic optoelectronic device of claim 13 wherein the fuse is unpatterned and deposited on the dielectric and wherein the fuse is comprised of any one of: (1) a metallic layer, (2) a combination of a metallic layer and an organic layer, (3) a combination of a metallic layer and a photoresist layer, (4) a combination of a metallic layer and a polycindine layer, and (5) a combination of a metallic layer and an oxide layer, or (6) a mixture thereof.

16. The protected organic optoelectronic device of claim 13 wherein the dielectric is comprised of any one of: photoresists, polyimides, metal-oxides, metal-nitrides, or metal-oxi-nitrides.

17. The protected organic optoelectronic device of claim 13 wherein the device is any one of an organic light emitting diode, a light source element, a light detector, or a solar cell.

18. A protected organic optoelectronic device, comprising:
an organic optoelectronic device; and
at least one of: (1) a first diode, and (2) a second diode,
wherein the first diode if present is coupled to the organic optoelectronic device, and the second diode if present is coupled to the organic optoelectronic device,
wherein the organic optoelectronic device coupled to one of the diodes includes
a first electrode on the substrate;
an organic stack on the first electrode;
a second electrode on the organic stack;
a p-type material of the diode on the substrate; and
a n-type material of the diode on the substrate and coupled to the p-type material,
wherein the second electrode is also on the p-type material of the diode.

19. The protected organic optoelectronic device of claim 18 wherein the first diode or the second diode is a silicon diode.

20. The protected organic optoelectronic device of claim 19 wherein the silicon diode is comprised of polycrystalline silicon, amorphous silicon, or single crystalline silicon.

21. The protected organic optoelectronic device of claim 18 wherein the organic optoelectronic device is any one of an organic light emitting diode, a light source element, a light detector, or a solar cell.

22. The protected organic optoelectronic device of claim 18 incorporated in a passive matrix display, an alphanumeric display, a light source, a detector array, or a solar cell array.

23. An organic light emitting diode integrity checking system to disable questionable OLEDs within an OLED display, comprising:
an OLED testing system;
an OLED, coupled to the OLED testing system, having a top electrode and a bottom electrode; and
a current limiting device coupled to a particular one of the electrodes of the OLED,
wherein the OLED testing system reverse biases the OLED and if the OLED testing system detects a reverse leakage current higher than a preset value, then it outputs a current at a rate that causes the current limiting device to prevent current flow across the OLED.

24. The integrity checking system of claim 23 wherein the current limiting device coupled to the top electrode includes
a first portion of the top electrode;
the current limiting device on the first portion of the top electrode; and
a second portion of the top electrode on the current limiting device,
wherein the current limiting device includes
a fuse on the first portion of the top electrode; and
a dielectric on the first portion of the top electrode that surrounds the fuse,
wherein the fuse couples together the first portion of the top electrode and the second portion of the top electrode.

25. The integrity checking system of claim 23 wherein the current limiting device coupled to the bottom electrode includes
a first portion of the bottom electrode;
the current limiting device on the first portion of the bottom electrode; and
a second portion of the bottom electrode on the current limiting device,
wherein the current limiting device includes
a dielectric between the first portion and the second portion of the bottom electrode; and
a fuse on the dielectric that couples together the first portion and the second portion of the bottom electrode.

26. A protected organic optoelectronic device, comprising:
an organic optoelectronic device; and
at least one of: (1) a first diode, and (2) a second diode,
wherein the first diode if present is coupled to the organic optoelectronic device, and the second diode if present is coupled to the organic optoelectronic device,
wherein the organic optoelectronic device coupled to one of the diodes includes
a substrate;
a first electrode on the substrate;
an organic stack on the first electrode;
a second electrode on the organic stack;
a n-type material of the diode on the substrate and coupled to the first electrode; and
a p-type material of the diode on the substrate and coupled to the n-type material.

27. The protected organic optoelectronic device of claim 26 wherein the first diode or the second diode is a silicon diode.

* * * * *